United States Patent [19]

Tan et al.

[11] Patent Number: 4,568,734

[45] Date of Patent: Feb. 4, 1986

[54] ELECTRON-BEAM AND X-RAY SENSITIVE POLYMERS AND RESISTS

[75] Inventors: Zoilo C. Tan; Robert C. Daly, both of Rochester, N.Y.

[73] Assignee: Eastman Kodak Company, Rochester, N.Y.

[21] Appl. No.: 588,636

[22] Filed: Mar. 12, 1984

Related U.S. Application Data

[63] Continuation-in-part of Ser. No. 466,710, Feb. 15, 1983, abandoned.

[51] Int. Cl.$^4$ .................... C08F 38/00; C08F 24/00
[52] U.S. Cl. .................................. 526/266; 430/287; 526/270; 526/273
[58] Field of Search .................... 526/266, 270, 273

[56] References Cited

U.S. PATENT DOCUMENTS

| | | | |
|---|---|---|---|
| 2,680,735 | 6/1954 | Fegley et al. | 526/270 |
| 2,877,215 | 3/1959 | Fang et al. | 526/270 |
| 3,842,051 | 10/1974 | Himics | 106/20 |
| 3,969,323 | 7/1976 | Furrer | 526/271 |
| 4,208,211 | 6/1980 | Bowden et al. | 156/643 |
| 4,277,554 | 7/1981 | Eranian et al. | 204/159.11 |
| 4,283,509 | 8/1981 | Zweifel et al. | 204/159.14 |
| 4,318,976 | 3/1982 | Shu | 204/159.2 |
| 4,388,448 | 6/1983 | Melby | 525/327.3 |
| 4,407,895 | 10/1983 | Nakauchi | 428/463 |

FOREIGN PATENT DOCUMENTS

| | | |
|---|---|---|
| 54-41891 | 12/1979 | Japan . |
| 1217756 | 12/1970 | United Kingdom . |
| 1336396 | 11/1973 | United Kingdom . |
| 1446981 | 8/1976 | United Kingdom . |

*Primary Examiner*—Christopher A. Henderson
*Attorney, Agent, or Firm*—Dana M. Schmidt

[57] ABSTRACT

There are disclosed polymers, E-beam sensitive elements and resists obtained therefrom, that are more sensitive than $5 \times 10^{-7}$ coulombs per cm$^2$ when exposed to a 15 keV electron beam. The polymers are copolymers of either allyl or propargyl methacrylate and of an acrylate or methacrylate bearing an oxygen-containing heterocyclic ring.

2 Claims, 1 Drawing Figure

ELECTRON-BEAM AND X-RAY SENSITIVE POLYMERS AND RESISTS

RELATED APPLICATIONS

This application is a continuation-in-part application of U.S. application Ser. No. 466,710, filed on Feb. 15, 1983, now abandoned.

FIELD OF THE INVENTION

This invention relates to photographically negative-working polymers suitable for exposure to electron beams or X-rays to form a resist image.

BACKGROUND OF THE INVENTION

Electron-beam resists are at the forefront of the manufacture of integrated circuits because they permit the formation of smaller images than do resists which are responsive only to light radiation. It is desirable that such electron-beam resists be more sensitive than $5 \times 10^{-7}$ coulombs/cm² when exposed to a 15 keV electron beam, and have a resistance to deformation by the developer solvent and a resistance to subsequent fabrication steps, e.g., etching, ion implantation, etc.

A superior negative-working electron-beam resist is described in U.S. Pat. No. 4,289,842. That resist comprises, in certain embodiments, copolymers of allyl methacrylate. Although such a resist has been particularly useful, it has demonstrated on occasion, and for reasons that are not completely understood, a sensitivity to the environment in which it is coated. More specifically, unless steps are taken to reduce such things as the amount of humidity in the environment, this resist tends occasionally to form severe edge scaling (residual amounts of unexposed polymer, resembling scales, projecting from the edges of the image after development and which are not removable). Although the problem can be overcome by controlling the environment, it would be advantageous to develop a negative-working resist of comparable quality that is not so sensitive to environmental conditions.

SUMMARY OF THE INVENTION

The present invention features photographically negative-working electron-beam resists having desirable electron-beam sensitivity and freedom from the edge scaling noted above. Such resists comprise copolymers of (a) either allyl or propargyl methacrylate and (b) an acrylate or methacrylate bearing an oxygen-containing heterocyclic ring.

Thus, it is an advantageous feature of the invention that an electron-beam resist is provided that is more sensitive than $5 \times 10^{-7}$ coulombs/cm² when exposed to 15 keV electrons, which is free of the edge scaling noted above under a wide variety of environmental conditions, has outstanding physical properties, for example, adhesion and plasma etch resistance, and makes use of copolymers of relatively low molecular weight.

These features of the invention are achieved, more specifically, by a polymer that is more sensitive than $5 \times 10^{-7}$ coulombs per cm² when exposed to a 15 keV electron beam. The polymer comprises recurring units having the structural formula

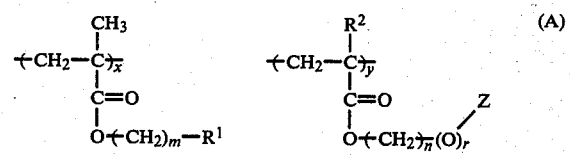

wherein
$R^1$ is —CH=CH₂ or —C≡CH,
$R^2$ is methyl or hydrogen,
Z is a heterocyclic ring having from 3 to 6 ring atoms selected from carbon and oxygen,
m = 0, 1, 2, or 3,
n = 1 or 2,
r is 0 or 1, and
x and y are mole percents such that
$50 \leq x \leq 95$
$5 \leq y \leq 50$.

In another aspect of the invention, such a resist provides an improved energy-sensitive element and a method of producing an electron-beam or X-ray resist image free of edge scaling. The method comprises the step of imagewise exposing a support bearing a layer of the aforesaid resist to electron-beam or X-ray radiation and developing the image by washing the layer with a solvent for the unexposed polymer.

Other features and advantages will become apparent upon reference to the following Description of the Preferred Embodiments when read in light of the attached drawing.

BRIEF DESCRIPTION OF THE DRAWING

The drawing is a reproduction of a photomicrograph of a portion of a resist image of the prior art, after development, which depicts severe edge scaling.

The polymers of the invention are hereinafter described primarily as materials useful as electron-beam resists. These polymers are also useful as resists for exposure to other forms of high energy radiation, such as X-ray radiation.

Figure 1:
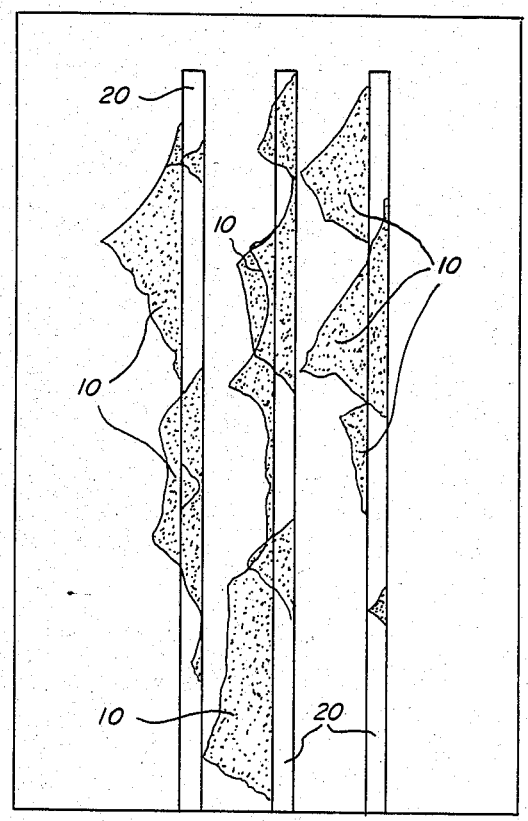

We have discovered that certain polymers demonstrate both outstanding E-beam sensitivity and resistance to edge scaling under a variety of environmental conditions. As used herein, "edge scaling" refers to conditions of the type shown in the Figure: Under certain high humidity conditions, the resist poly(allyl methacrylate-co-hydroxyethyl methacrylate), having, for example, a M̄w of about 42,000, following exposure to a line pattern spaced 5 to 10 μ apart and development with the solvent 2-ethoxyethyl acetate/isopropyl alcohol (1:1 by v), will show under a microscope, resist portions 10 that look like scales projecting away from the edges of lines 20. The scale portions 10 are unexposed portions of the resist polymer which not only were not developed (removed) by the solvent, but also are resistant to removal by conventional descumming procedures. Such scales are distinguishable from minor scum sometimes encountered, which is readily removable by an oxygen plasma. The scales are, of course, objectionable because they act as a protective resist over areas of the substrate that should not be protected from subsequent etching.

The resist comprises the copolymers described above. As noted, Z is a heterocyclic ring, and as used herein, "heterocyclic ring" includes both substituted and unsubstituted heterocyclic rings, as well as saturated and unsaturated heterocyclic rings having the ring atoms that conform to the specified requirements. Preferred examples of substituents on such substituted rings include one or two alkyl groups each of from 1 to 3 carbon atoms, for example, methyl, ethyl, propyl, isopropyl and the like; halo, for example, chloro, fluoro, and the like; cyano; and alkoxy of from 1 to 3 carbon atoms, for example, methoxy, ethoxy, and propoxy. Particularly preferred heterocyclic rings include glycidyl; furyl; pyranyl; and 2,2-dimethyldioxalanyl. Particularly preferred examples of useful copolymers for this invention include poly(allyl methacrylate-co-glycidyl methacrylate); poly(allyl methacrylate-co-2,2-dimethyl-4-dioxalanylmethyl methacrylate); poly(propargyl methacrylate-co-2,2-dimethyl-4-dioxalanylmethyl methacrylate); poly[allyl methacrylate-co(2H-2-tetrahydropyranyloxy)ethyl methacrylate]; poly(allyl methacrylate-co-2-furfuryl methacrylate); poly(propargyl methacrylate-co-glycidyl methacrylate; and poly(allyl methacrylate-co-2,2-dimethyl-4-dioxalanylmethyl acrylate).

Other comonomers can be included to form recurring units in the polymer of the invention, provided that they are compatible with the preferred comonomers (they do not interfere with the crosslinking of the polymer). Preferably, to insure maximum sensitivity and etch resistance, x and y of formula (A) above together comprise at least 70 mole percent of the polymer. Most preferably other comonomers are not included, and y is between 5 and 50 mole percent. It has been found that such polymers have better adhesion with high speed and good plasma etch resistance.

The polymers of the invention have electron-beam sensitivities that meet the above-noted requirement of $5 \times 10^{-7}$ coulombs/cm$^2$. In several cases, they are much more sensitive. Such results are achieved for weight average molecular weights (hereinafter "$\overline{Mw}$") that are, in most cases, well below 100,000. Thus, on a per molecular weight basis, the polymers of the invention comprise very sensitive negative-working electron-beam resists. Electron-beam sensitivities herein described were determined, as is conventional, by exposing identical coatings to increased dosage values and measuring the amount of resist remaining in the exposed area after development. The sensitivity is that dosage required to crosslink enough of the composition to retain 50% of the initial coating thickness. The smaller the dosage, the less energy that is required, and therefore the more sensitive is the polymer.

The molecular weights of useful polymers of the invention vary widely. Preferably the polymer has a low enough viscosity in the solvent of choice to permit it to be coated. It has been found that useful viscosities are generally 0.3 inherent viscosity or less, as measured in N,N-dimethylformamide at 25° C. However, very low-molecular weights tend to reduce the electron-beam sensitivity undesirably. Preferably, therefore, the styrene equivalent weight average molecular weight of the polymer, as determined by gel permeation chromatography analysis, is between about 10,000 and about 70,000. Most preferably, it is between about 25,000 and about 45,000 for the dioxalanyl copolymers, 30,000 to 60,000 for the glycidyl and furfuryl copolymers, and 25,000–55,000 for the tetrahydropyranyloxy copolymers.

In addition, the copolymers useful to make the resist of this invention, preferably have a polydispersity of between about 2.0 and about 4.0, and a glass transition temperature (Tg) of at least 70° C. These values are characteristic of the free-radical process of making them, and are not achievable by other processes such as anionic polymerization.

A further advantage of the polymers of the invention is in improved film properties of the coated polymers, such as adhesion to supports that are to be resist-coated. These properties are unexpectedly superior compared to the properties of the homopolymers that result when one of the comonomers is not present. For example, the homopolymer of allyl methacrylate demonstrates unsatisfactory adhesion to chrome-clad glass when exposed to dosages greater than $5 \times 10^{-7}$ coulomb/cm$^2$. Similarly, the homopolymer of propargyl methacrylate tends to lose adhesion when over-exposed. Poly(dioxalanyl methacrylate) also fails to adhere following image development, for the reason that it is insensitive to E-beams at the aforesaid dosage and will not crosslink to provide insoluble portions. Poly(glycidyl methacrylate), though adherent, is unstable when stored.

The polymers of the invention are prepared by conventional free-radical synthesis techniques. It should be noted however that dilute reaction conditions are preferred to avoid undesirable crosslinking. The following preparations are illustrative.

Preparation 1. Preparation of Poly(allyl methacrylate-co-2,2-dimethyl-4-dioxalanylmethyl methacrylate)

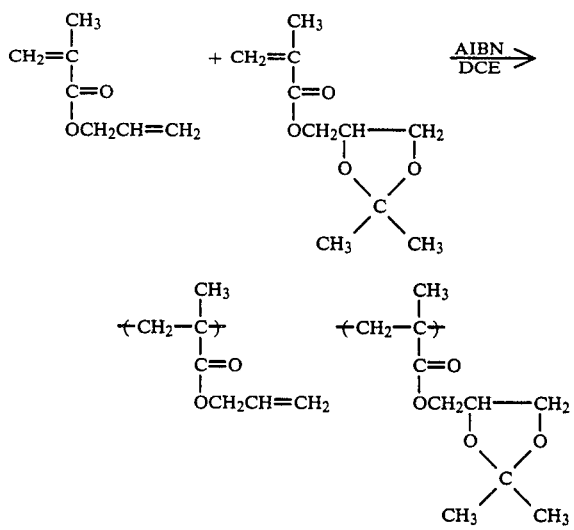

In a 5 l 3-neck flask, 2.5 l of 1,2-dichloroethane (DCE) was heated under a nitrogen atmosphere to a mild reflux. A monomer solution was prepared containing:

100 g allyl methacrylate (0.79 mole)

56.6 g 2,2-dimethyl-4-dioxalanylmethyl methacrylate (0.26 mole)

0.87 g 2,2'-azobis(2-methylpropionitrile) (AIBN) 750 ml DCE.

The monomer solution was added slowly to the stirred, refluxing DCE (over a one-hour period). Reflux was maintained for 20 hours after the addition was completed. The reaction mixture was allowed to cool, filtered, and reduced to ~1 l on the rotary evaporator. The product was precipitated into 10 ml of vigorously stirred heptane. The precipitate was collected on a Buchner funnel, washed with fresh heptane, then dried under vacuum with a nitrogen bleed at room temperature for 48 hours. Yield: 102.4 g (65%). (In the allyl methacrylate polymer products herein described, there is present some amount of polymerized cyclized allyl methacrylate monomer that does not conform to the structure noted.)

| Tg = 102° C. | | Elemental Analysis | | |
|---|---|---|---|---|
| | | N % | C % | H % |
| GPC | $\overline{Mn}$ = 18,469  Theory | 0 | 64.3 | 8.0 |
| | $\overline{Mw}$ = 42,641  Found | <0.3 | 64.2 | 8.0 |
| Ratio ($\overline{Mn}/\overline{Mw}$) = 2.31 (polydispersity) | | | | |

Preparation 2. Preparation of Poly(allyl methacrylate-co-glycidyl methacrylate)

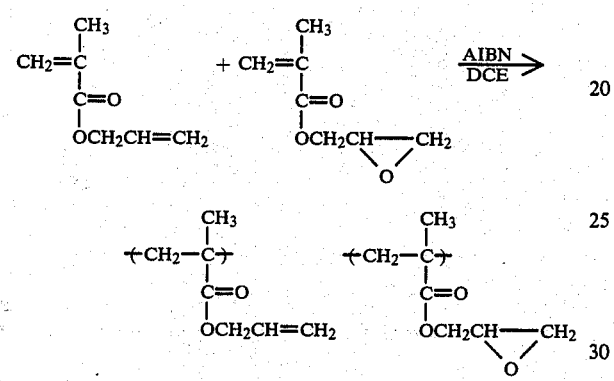

A 12-liter round-bottom reaction vessel equipped with magnetic stirrer, reflux condenser, pressure-equalized dropping funnel, nitrogen inlet and heating mantle was charged with 4.5 liters of DCE. The system was purged with nitrogen and reflux established. To the reaction vessel was added dropwise a solution of 200 g of allyl methacrylate (1.59 moles, 75 g of glycidyl methacrylate (0.53 mole), and 3 g of 2,2'-azobis(2-methylpropionitrile) (AIBN) ($1.8 \times 10^{-2}$ moles) in 1 liter of DCE, over the period of ½ hour. Reflux was maintained overnight. One-half of the solvent was removed on a rotary evaporator and the remaining solution was added dropwise to 25 liters of vigorously stirred heptane to precipitate the polymer. The white, solid polymer was collected on a filter funnel, washed twice with 500 ml of fresh heptane, and dried in vacuum with no heat. 210 g yield, 76%. $\overline{Mw}$=34,459, $\overline{Mn}$=14,407, $\overline{Mw}\overline{Mn}$=2.39 by gel permeation chromatography. Tg32 109° C. (In contrast, the Tg for this polymer when prepared by anionic polymerization was only 37° C.)

Preparation 3. Preparation of Poly[allyl methacrylate-co-2-(2H-2-tetrahydropyranyloxy)ethyl methacrylate)]

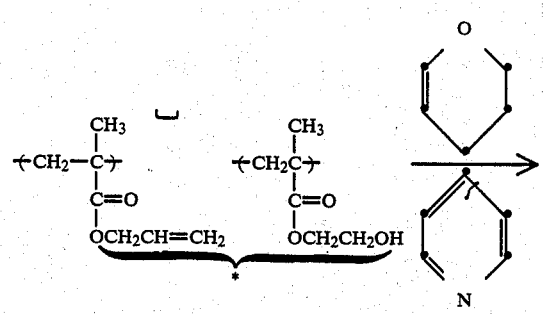

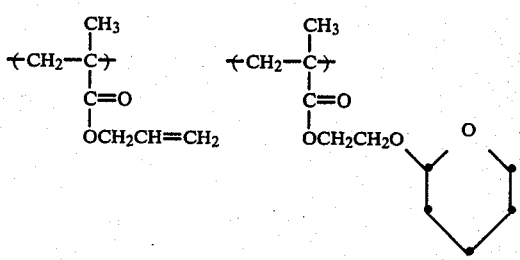

-continued

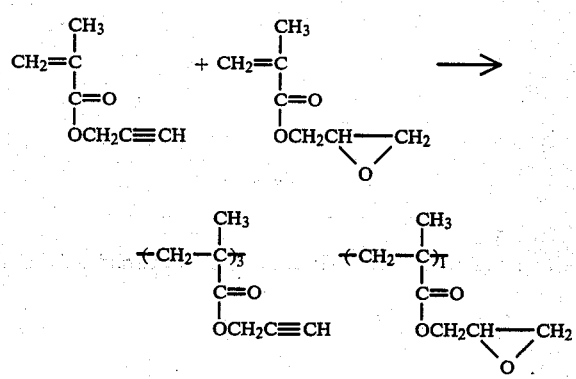

*(as described in U.S. Pat. No. 4,289,842)

The starting copolymer was dissolved in 1800 ml of dry pyridine. The solution was stirred under nitrogen and warmed to reflux. Dihyropyran (25.5 g, 0.30 mole) was then added and the reflux continued for 6 hrs. The reaction mixture was then cooled to room temperature and filtered to remove any insoluble polymer.

The polymer solution was precipitated into water through an aspirator and washed completely with cold water several times. The polymer was collected and dried at room temperature under vacuum with a nitrogen bleed for 72 hrs. Yield: 94 g.

$\overline{Mn}$=14,000; $\overline{Mw}$=41,850, $\overline{Mw}/\overline{Mn}$=2.99 (polystyrene equivalent weights). Tg=109° C.

Preparation 4. Preparation of Poly(propargyl methacrylate-co-glycidyl methacrylate DCE (2.7 l) was warmed to gentle reflux with stirring under a nitrogen atmosphere. A monomer-initiator solution was prepared by dissolving 111.7 g (0.9 mole) of propargyl methacrylate, 42.7 g (0.3 mole) of glycidyl methacrylate and 0.77 g of AIBN in 700 ml of DCE. Reflux was continued while the monomer-initiator solution was added over a 30-minute period. Reflux continued for 16 hours and then the reaction vessel was allowed to return to room temperature.

The polymer solution was reduced in volume to about 1.5 l, on a rotary evaporator. The reduced solution was added dropwise to 12 l of vigorously stirred heptane. A granular white precipitate was obtained and isolated by collecting on a filter. The collected polymer was washed twice with heptane and dried at room temperature under vacuum with a nitrogen bleed.

Obtained—50 g of white polymer (32%)

$M/\overline{n}$=6867, $\overline{Mw}$=9609, $\overline{Mw}/\overline{Mn}$=1.4 (polystyrene equivalent weights)

Although these molecular weights did not produce the desired polydispersity of between 2.0 and 4.0, such is achievable by reducing the amount of solvent during polymerization, so that the value of $\overline{Mw}$ is increased. $Tg=87°$ C.

| Elemental Analysis | % C | % H | % O |
|---|---|---|---|
| Theory | 65.4 | 6.7 | 28.0 |
| Found | 65.3 | 6.7 | 26.7 |

As a resist, the polymers of the invention are preferably coated onto the support that is to be etched. Preferably the coating composition is free of sensitizers and initiators, to permit white-light handling. The resist is then dried, imagewise exposed, and developed to remove the unexposed portions. Any suitable support is useful. Particularly preferred examples of supports include semiconductors such as silicon wafers, chrome-clad glass, and metals such as aluminum.

Conventional solvents are useful for both the coating step and the development step. Preferred examples of solvents useful for either process step include 2-methoxyethyl acetate, 2-ethoxyethyl acetate, 2-ethoxyethanol, 2-butanone, cyclohexanone, cyclopentanone, 4 butyrolactone, and mixtures of these with 2-propanol or ethanol.

Conventional coating procedures are useful to apply the polymer to the support. Preferred are whirler or spin coating, brushing, doctor-blade coating, or hopper coating. Further details of such conventional procedures are described in *Product Licensing Index*, Vol. 92, Dec. 1971, Publication No. 9232, at p. 109.

The drying step is preferably accomplished by baking in an oven, optionally in a vacuum, for example, at 90° C. for 30 minutes.

Optionally, a conventional post-bake step is included after exposure and development to enhance adhesion of the final resist coating to the areas to be protected, prior to etching.

Etching of the underlying support is achieved by using a chemical solvent for the support, or by treatment with a plasma gas, both of which are conventional.

EXAMPLES

The following Examples further illustrate the invention.

Examples 1–5

To demonstrate resistance to edge scaling, the polymers of Table I in 2-ethoxyethyl acetate were coated onto SiO$_2$-coated silicon wafers at a thickness of 0.5 micron (each example). The resist polymers were image-wise exposed to an electron beam of 20 keV energy, stored at 100% relative humidity for about 12 hours, and developed in 1:1 (by volume) 2-ethoxyethyl acetate/isopropanol for 30 seconds. Thereafter, the samples were spin-spray rinsed with isopropanol. The resistance to edge scaling was determined by microscopic observation-see Table I.

TABLE I

| Example | Polymer | Was Edge Scaling Present? |
|---|---|---|
| Control | Poly(allyl methacrylate-co-hydroxyethyl methacrylate) (3:1)* | Yes-Similar to that of the FIG. of the drawing |
| 1 | Poly(allyl methacrylate-co-glycidyl methacrylate)(3:1) | scaling |
| 2 | Poly(allyl methacrylate-co-2,2-dimethyl-4-dioxalanylmethyl methacrylate) (3:1) | No-free of edge scaling |
| 3 | Poly(propargyl methacrylate-co-2,2-dimethyl-4-dioxalanylmethyl methacrylate) (3:1) | No-free of edge scaling |
| 4 | Poly[allyl methacrylate-co-2-(2H—2-tetrahydropyranyloxy)ethyl methacrylate] (3:1) | No-free of edge scaling |
| 5 | Poly(allyl methacrylate-co-2-furfuryl methacrylate) (3:1) | No-free of edge scaling |

*All mole ratios of this table are expressed in terms of the ratios of the comonomers incorporated into the polymer.

Examples 1–5 were repeated, and these coated wafers were exposed at 15 keV to determine their sensitivity. Sensitivity curves were plotted, and the contrast was determined as the slope of the sensitivity curve at the 50% thickness point. A Comparative Example was prepared by the procedure of Example 1, except that the polymer was poly(allyl methacrylate-co-4-methyl-2H-2-pyranon-6-ylmethyl methacrylate at a $\overline{Mw}$ of 30,700. (See British Patent Pub. No. 1,446,981.) The results appear in Table II.

TABLE II

| Ex. | Polymer | Mw | Sensitivity (Coulombs/cm$^2$) | Contrast |
|---|---|---|---|---|
| 1 | Poly(allyl methacrylate-co-glycidyl methacrylate) | 34,500 | $3.4 \times 10^{-7}$ | 1.1 |
| 2 | Poly(allyl methacrylate-co-2,2-dimethyl-4-dioxalanyl methyl methacrylate) | 38,400 | $3.5 \times 10^{-7}$ | 1.2 |
| 3 | Poly(propargyl methacrylate-co-2,2-dimethyl-4-dioxalanyl methyl methacrylate) | 10,400 | $2.2 \times 10^{-7}$ | 1.0 |
| 4 | Poly[allyl methacrylate-co-2-(2H-2-tetrahydropyranyloxy)ethyl methacrylate] | 42,000 | $2 \times 10^{-7}$ | 0.94 |
| 5 | Poly(allyl methacrylate-co-2-furfuryl methacrylate) | 62,400 | $5.0 \times 10^{-7}$ | 0.85 |
| Com. Ex. | — | 30,700 | $6.0 \times 10^{-7}$ | 1.1 |

The value of $6.0 \times 10^{-7}$ of the comparative example, by reason of the larger exposure required as indicated by the larger number, is not as sensitive as the values $\leq 5 \times 10^{-7}$ provided by the polymers of the invention, and was considered unacceptable.

EXAMPLES 6–8

Examples 1, 2 and 4 were repeated as Examples 6, 7 and 8, and following development, the samples were etched with a plasma etch of 91.5% CF$_4$ and 8.5% O$_2$, applied at 100 w, 0.7 Torr pressure. As controls, two separate layers of poly(methyl methacrylate) and a commercial copolymer of glycidylmethacrylate and ethyl acrylate, available under the trademark "KTI-MEAD COP" from KTI Chemicals, Inc., were similarly coated, exposed, developed and etched. Examples 6-8 demonstrated greater etch resistance than did the two controls.

EXAMPLE 9

Poly(allyl methacrylate-co-2,2-dimethyl-4-dioxalanylmethyl acrylate), having a mole ratio of 3:1 for the comonomers incorporated into the polymer, was coated onto a chrome-clad glass, exposed to a 15 KeV electron beam, and developed for 1 minute with a 1:1 mixture of 2-ethoxyethyl acetate and ethanol. Following the procedure of Example 5, the sensitivity and contrast were found to be $4.1 \times 10^{31\,7}$ coulombs/cm$^2$ and 1.22, respectively.

Example 10-13—Sensitivity as Affected by Monomer Ratios

Poly(allyl methacrylate-co-glycidyl methacrylate)$_{x:y}$ was produced with varying mole ratios of x and y to determine the effect on sensitivity. The results appear in Table III:

TABLE III

| | | | Variable Monomer Ratios | | | | | |
|---|---|---|---|---|---|---|---|---|
| Ex. | Ratio$^a$ x:y | Yield % | $\overline{Mw}$ $^b$ | $\overline{Mn}$ $^b$ | $\overline{Mw}/\overline{Mn}$ $^b$ | 15 keV Sensitivity C/cm$^2$ | Contrast | Tg (°C.) |
| 10 | 2:1 | 59 | 32,396 | 14,039 | 2.31 | $4.63 \times 10^{-7}$ | 1.01 | >100$^c$ |
| 11 | 3:1 | 62 | 29,317 | 13,110 | 2.24 | $3.83 \times 10^{-7}$ | 1.25 | >100$^c$ |
| 12 | 4:1 | 70 | 45,238 | 16,742 | 2.70 | $2.52 \times 10^{-7}$ | 0.91 | >100$^c$ |
| 13 | 7:1 | 67 | 45,503 | 17,790 | 2.56 | $2.51 \times 10^{-7}$ | 0.97 | >100$^c$ |

$^a$All reactions run in dichloroethane, 5% wt./vol. monomer to solvent concentration, 0.56% wt./wt. initiator (AIBN) to monomer.
$^b$$\overline{Mw}$, $\overline{Mn}$, $\overline{Mw}/\overline{Mn}$ were determined in THF as polystyrene equivalents using size exclusion chromatography.
$^c$Estimated only.

This data suggests that the greater the value of x, up to a ratio of 4:1, the more sensitive is the polymer. There appeared to be no change when the ratio was increased to 7:1 compared to 4:1.

The invention has been described in detail with particular reference to preferred embodiments thereof, but it will be understood that variations and modifications can be effected within the spirit and scope of the invention.

What is claimed is:

1. A polymer more sensitive than $5 \times 10^{-7}$ coulombs per cm$^2$ and substantially free of edge-scaling when exposed to a 15 keV electron beam and developed as a resist, said polymer having a polydispersity of between 2.0 and 4.0 and comprising recurring units having the structural formula

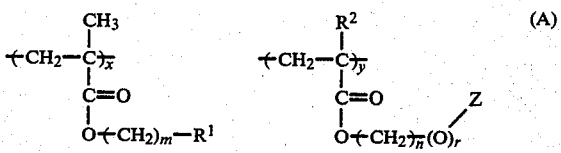

wherein
$R^1$ is —CH=CH$_2$ or —C≡CH,
$R^2$ is methyl or hydrogen,
Z is a heterocyclic ring having from 3 to 6 ring atoms selected from carbon and oxygen,
m is 0, 1, 2, or 3,
n is 1 or 2,
r is 0 or 1, and
x and y are mole percents such that
$50 \leq x \leq 95$
$5 \leq y \leq 50$.

2. A polymer more sensitive than $5 \times 10^{-7}$ coulombs per cm$^2$ and substantially free of edge-scaling when exposed to a 15 keV electron beam and developed as a resist, said polymer having a polydispersity of between 2.0 and 4.0 and being selected from the group consisting of (a) poly(allyl methacrylate-co-glycidyl methacrylate)$_{x:y}$,
(b) poly(allyl methacrylate-co-2,2-dimethyl-4-dioxalanylmethyl methacrylate)$_{x:y}$,
(c) poly(propargyl methacrylate-co-2,2-dimethyl-4-dioxalanylmethyl methacrylate)$_{x:y}$,
(d) poly[allyl methacrylate-co-(2H-2-tetrahydropyranyloxy)ethanyl methacrylate]$_{x:y}$,
(e) poly(allyl methacrylate-co-2-furfuryl methacrylate)$_{x:y}$,
(f) poly(propargyl methacrylate-co-glycidyl methacrylate)$_{x:y}$, and
(g) poly(allyl methacrylate-co-2,2-dimethyl-4-dioxalanylmethyl acrylate)$_{x:y}$, wherein
x and y are mole percents such that
$50 \leq x \leq 95$
$5 \leq y \leq 50$.

* * * * *